US009633995B2

(12) United States Patent
Babcock et al.

(10) Patent No.: US 9,633,995 B2
(45) Date of Patent: Apr. 25, 2017

(54) METHOD OF FORMING A GATE SHIELD IN AN ED-CMOS TRANSISTOR AND A BASE OF A BIPOLAR TRANSISTOR USING BICMOS TECHNOLOGIES

(71) Applicant: Texas Instruments Incorporated, Dallas, TX (US)

(72) Inventors: Jeffrey A. Babcock, Sunnyvale, CA (US); Alexei Sadovnikov, Sunnyvale, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/050,808

(22) Filed: Feb. 23, 2016

(65) Prior Publication Data

US 2016/0172245 A1    Jun. 16, 2016

Related U.S. Application Data

(63) Continuation of application No. 14/286,805, filed on May 23, 2014, now Pat. No. 9,306,013.

(51) Int. Cl.
| | |
|---|---|
| *H01L 21/8249* | (2006.01) |
| *H01L 27/06* | (2006.01) |
| *H01L 29/78* | (2006.01) |
| *H01L 29/40* | (2006.01) |
| *H01L 29/66* | (2006.01) |
| *H01L 29/423* | (2006.01) |
| *H01L 21/3213* | (2006.01) |

(Continued)

(52) U.S. Cl.
CPC .... *H01L 27/0623* (2013.01); *H01L 21/32139* (2013.01); *H01L 21/8249* (2013.01); *H01L 29/0649* (2013.01); *H01L 29/402* (2013.01); *H01L 29/423* (2013.01); *H01L 29/456* (2013.01); *H01L 29/4916* (2013.01); *H01L 29/66553* (2013.01); *H01L 29/66575* (2013.01); *H01L 29/66681* (2013.01); *H01L 29/66689* (2013.01); *H01L 29/66712* (2013.01); *H01L 29/78* (2013.01); *H01L 29/7816* (2013.01); *H01L 29/7824* (2013.01); *H01L 29/7835* (2013.01); *H01L 29/0653* (2013.01)

(58) Field of Classification Search
CPC ............ H01L 29/1087; H01L 29/7835; H01L 29/402; H01L 29/7813; H01L 29/41775; H01L 29/1045; H01L 29/4175; H01L 29/165; H01L 29/41708; H01L 27/0623; H01L 21/8249; H01L 29/161
USPC ......... 438/571, 586; 257/262, 328, 335, 339
See application file for complete search history.

(56) References Cited

U.S. PATENT DOCUMENTS

| | | |
|---|---|---|
| 5,119,149 A | 6/1992 | Weitzel et al. |
| 5,252,848 A | 10/1993 | Adler et al. |

(Continued)

*Primary Examiner* — Thomas L Dickey
*Assistant Examiner* — Changhyun Yi
(74) *Attorney, Agent, or Firm* — Tuenlap D. Chan; Charles A. Brill; Frank D. Cimino

(57) ABSTRACT

A method of fabricating a MOSFET transistor in a SiGe BICMOS technology and resulting structure having a drain-gate feedback capacitance shield formed between a gate electrode and the drain region. The shield does not overlap the gate and thereby minimizes effect on the input capacitance of the transistor. The process does not require complex or costly processing since the shield is composed of bipolar base material commonly used in SiGe BICMOS technologies.

20 Claims, 10 Drawing Sheets

FIG. 1A

(51) Int. Cl.
*H01L 29/06* (2006.01)
*H01L 29/45* (2006.01)
*H01L 29/49* (2006.01)

(56) References Cited

U.S. PATENT DOCUMENTS

| | | | |
|---|---|---|---|
| 5,661,048 A * | 8/1997 | Davies | H01L 21/82385 |
| | | | 257/E21.427 |
| 6,001,710 A | 12/1999 | Francois et al. | |
| 6,091,110 A | 7/2000 | Hebert et al. | |
| 6,107,160 A | 8/2000 | Hebert et al. | |
| 6,215,152 B1 | 4/2001 | Hebert | |
| 9,306,013 B2 * | 4/2016 | Babcock | H01L 27/0623 |
| 2006/0001102 A1 | 1/2006 | Pendharkar | |
| 2007/0029283 A1 | 2/2007 | Keller | |
| 2010/0051946 A1 * | 3/2010 | Jun | H01L 21/8249 |
| | | | 257/49 |
| 2014/0346597 A1 | 11/2014 | Feilchenfeld et al. | |
| 2015/0179754 A1 * | 6/2015 | Hung | H01L 29/6625 |
| | | | 438/309 |

\* cited by examiner

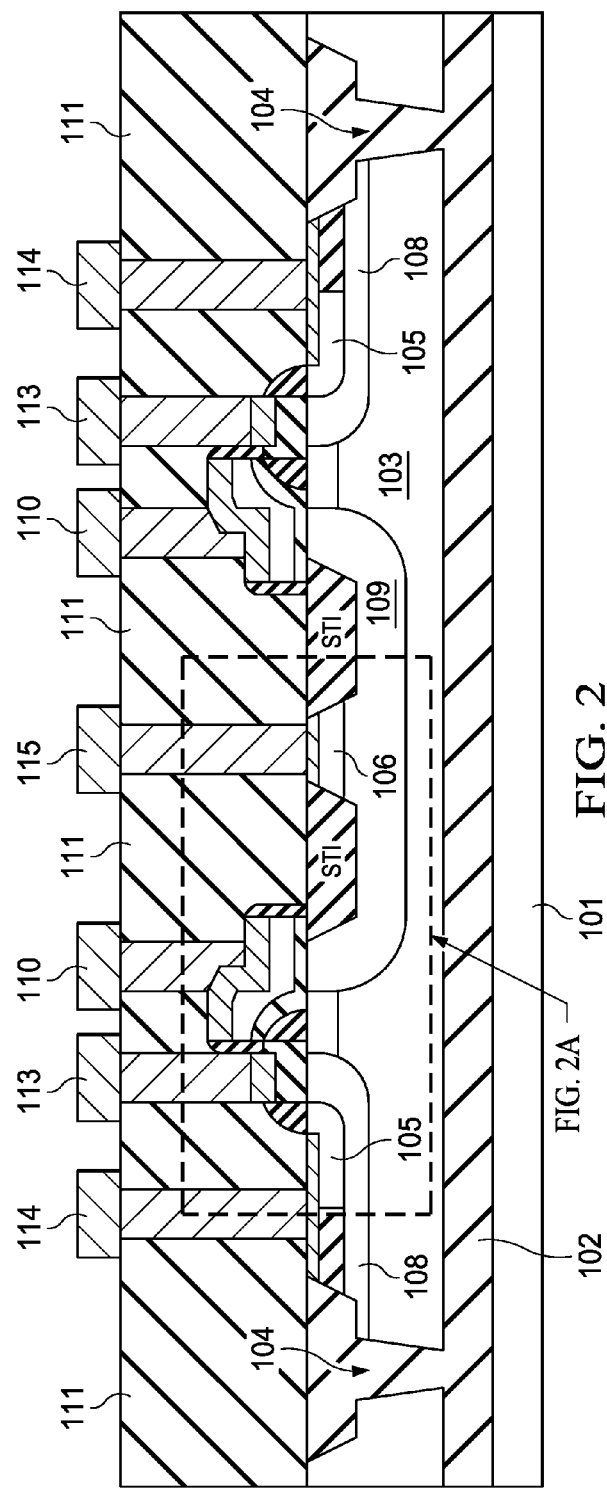
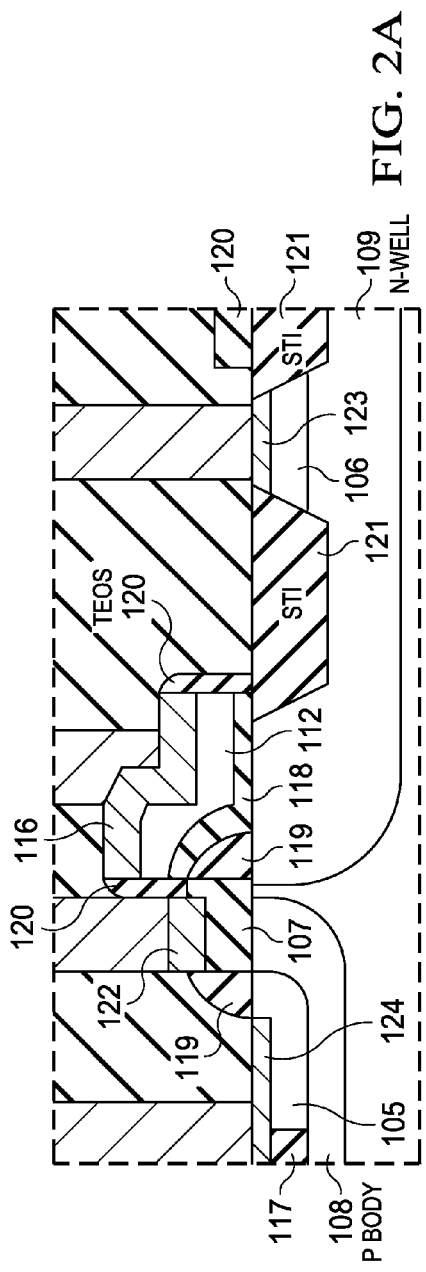
FIG. 2
FIG. 2A

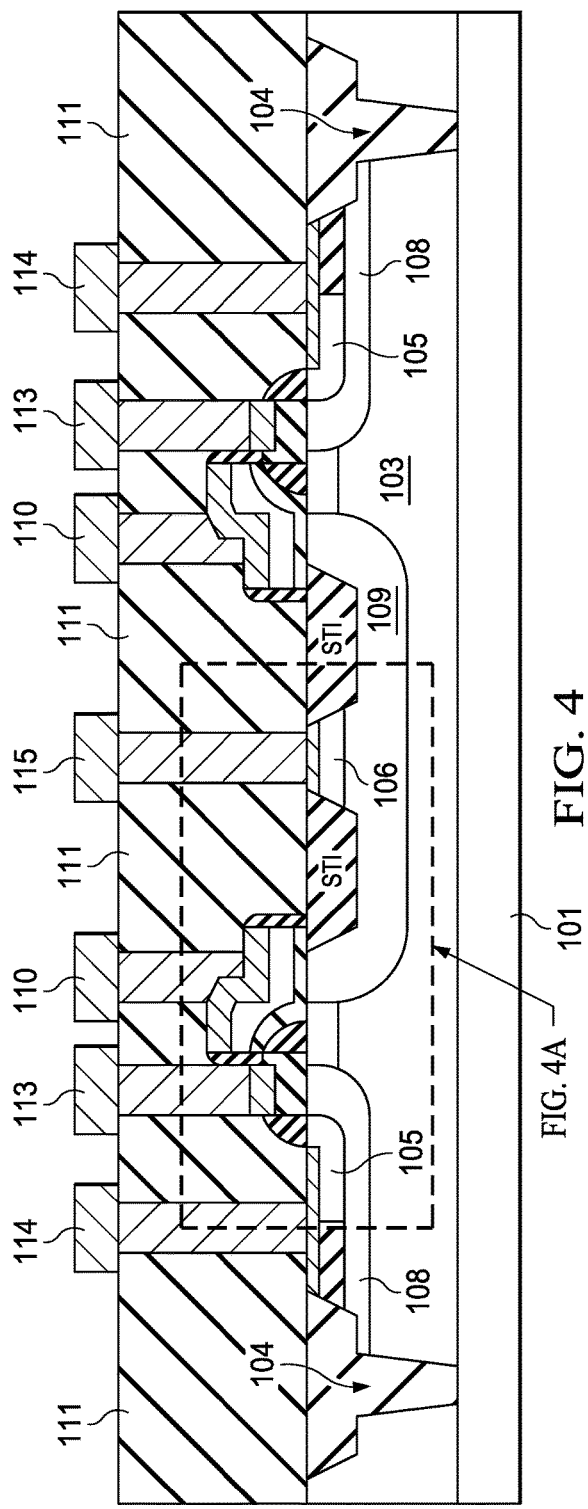
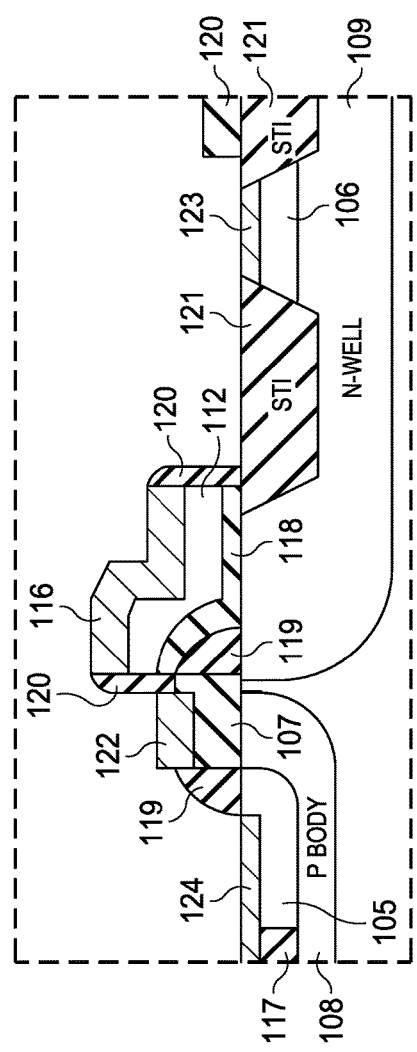

METHOD OF FORMING A GATE SHIELD IN AN ED-CMOS TRANSISTOR AND A BASE OF A BIPOLAR TRANSISTOR USING BICMOS TECHNOLOGIES

CROSS-REFERENCE TO RELATED APPLICATIONS

Under 35 U.S.C. §120, this continuation application claims priority to and benefits of U.S. patent application Ser. No. 14/286,805, filed on May 23, 2014, the entirety of which is incorporated herein by reference.

FIELD OF THE INVENTION

This invention relates generally to MISFET (MOSFET) devices having source and drain regions connected by a gate-controlled channel, and more particularly the invention relates to a MOSFET device having a reduced drain-gate feedback capacitance provided by gate-drain shields to reduce capacitive coupling.

BACKGROUND OF THE INVENTION

The MOSFET device has many electrical applications including use as an RF/microwave amplifier. In such an application, the gate to drain feedback capacitance ($C_{gd}$ or $C_{rss}$) must be minimized in order to maximize RF gain and minimize signal distortion. The gate to drain feedback capacitance is critical since it is effectively multiplied by the voltage gain of the device or $C_{effective} = C_{rss}(1+gm\ R_1)$ where gm is the transconductance and $R_1$ is the load impedance.

Heretofore, Faraday shields have been employed between the gate and drain electrodes in an attempt to minimize the feedback capacitance. Adler et al. U.S. Pat. No. 5,252,848 discloses a MOSFET structure in which a shield is provided over the gate electrode and which terminates over the drain electrode. The shield comprises a polysilicon layer with resistance of 100 ohms/square or less formed over a nitride film over a stress relief oxide formed directly over the gate. The structure is effective, but the fabrication of the device is complex due to the two polysilicon layers which are required. Weitzel U.S. Pat. No. 5,119,149 discloses a gallium arsenide MESFET structure in which a shield conductor is placed between the gate and drain electrodes without overlapping the gate. The gate to drain capacitance is not minimized since the metal electrode is placed over the passivation dielectric material for the gate structure.

The present invention is directed to a fabrication method and resulting MOSFET device which does not require complex or costly processing and which reduces the gate-drain feedback capacitance without any increase in the input capacitance of the device.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

In accordance with an embodiment of the present application, a laterally diffused metal oxide semiconductor LDMOS, having a gate shield, wherein the laterally diffused metal oxide semiconductor LDMOS, having a gate shield comprises: a substrate; an active device region formed on the surface of the substrate; a body well formed in the LDMOS transistor area of the active device region; a lateral drain well also formed in the LDMOS transistor area of active device region, wherein the body well and the lateral drain well are spaced apart from one another and do not touch; a source and a drain are formed in the LDMOS transistor area, wherein the source is formed in the body well and the drain is formed in the lateral drain well, wherein the source and drain have a lateral spacing between them; a gate structure formed on the body well located on the space between the source and the active device region; wherein the gate structure includes a gate oxide applied across the top of the body well between the source and the active device region; gate polysilicon formed on the top surface of the gate oxide; a gate electrode formed on the top surface of the gate polysilicon; a gate shield formed between the gate electrode and the drain, wherein the shield is separated from the gate electrode by a base shield spacer; wherein the gate shield is separated from the gate polysilicon by a gate poly spacer and a shield dielectric; the gate shield is comprised of a bipolar base structure used in the bipolar transistor area of the BICMOS wafer, wherein the gate shield abuts to, but does not overlap the gate polysilicon, and is confined to a limited area between gate polysilicon and a portion of the lateral drain well; source, drain, gate, gate shield and body contacts are formed on the source, drain, gate, gate shield and body of the LDMOS transistor; a dielectric formed on the LDMOS structure including openings for the source, drain, gate and body contacts; and a metal layer deposited and defined to form the gate electrode, a body electrode, a source electrode, a gate shield electrode and a drain electrode.

In accordance with another embodiment of the present application, a laterally diffused metal oxide semiconductor LDMOS, having a gate shield, wherein the laterally diffused metal oxide semiconductor LDMOS, having a gate shield comprises: a substrate; an active device region formed on the surface of the substrate; a body well formed in the LDMOS transistor area of the active device region; a lateral drain well also formed in the LDMOS transistor area of active device region, wherein the body well and the lateral drain well are spaced apart from one another and do not touch; a source and a drain are formed in the LDMOS transistor area, wherein the source is formed in the body well and the drain is formed in the lateral drain well, wherein the source and drain have a lateral spacing between them; a shallow trench isolation region is contained within in the lateral drain well and extends laterally outwardly from the drain but does not touch the sides of the lateral drain well; a gate structure formed on the body well located on the space between the source and the active device region; wherein the gate structure includes a gate oxide applied across the top of the body well between the source and the active device region; gate polysilicon formed on the top surface of the gate oxide; a gate electrode formed on the top surface of the gate polysilicon; a gate shield formed between the gate electrode and the drain, wherein the shield is separated from the gate electrode by a base shield spacer; wherein the gate shield is separated from the gate polysilicon by a gate poly spacer and a shield dielectric; the gate shield is comprised of a bipolar base structure used in the bipolar transistor area of the BICMOS wafer, wherein the gate shield abuts to, but does not overlap the gate polysilicon, and is confined to a limited area between gate polysilicon and a portion of the lateral drain well; source, drain, gate, gate shield and body contacts are formed on the source, drain, gate, gate shield and body of the LDMOS transistor; a dielectric formed on the LDMOS structure including openings for the source, drain, gate and body contacts; and a metal layer deposited and defined to form the gate electrode, a body electrode, a source electrode, a gate shield electrode and a drain electrode.

In accordance with still another embodiment of the present application, a method of forming a lateraLly diffused metal oxide semiconductor LDMOS, having a gate shield, wherein the method of forming a laterally diffused metal oxide semiconductor LDMOS, having a gate shield comprises: providing an SOI or bulk silicon wafer, wherein the SOI wafer includes a silicon substrate, a first silicon layer and a buried oxide BOX therebetween; Implanting N+NBL and P+PBL impurities into the top surface of the first silicon layer, in areas designated as NPN or PNP transistors respectively in the completed wafer; depositing a second silicon layer is over and touching the NBL, the PBL and the first silicon layer, wherein the first silicon layer and the second silicon layer in combination form an active device layer; forming P- and N-wells in the active device layer to form the bodies of the N channel and P channel transistors respectively; forming shallow trench isolation STI areas in portions of the P- and N-wells; depositing gate oxide; defining and implanting sources and drains; depositing and defining gate polysilicon; depositing a gate poly seal is deposited on the gate polysilicon; wherein the gate poly seal oxide is 80 Å of SiO2 grown on the poly, using 900° C. Dilute Dry O2 for 44 minutes; depositing a spacer material on the gate poly seal, wherein the spacer material is 300 Å of PECVD TEOS; depositing spacer nitride on the spacer material; depositing a 200 Å TEOS layer over the entire wafer; depositing a 500 Å amorphous-silicon seed layer; patterning and etching the NPN base oxide window OXWIND and stripping the photoresist after etching; depositing an NPN Epitaxial Base; patterning and etching the poly shield, wherein the NPN poly base is etched with a LAM etcher; etching base-epitaxial poly on STI areas, etching will stop on the oxide window TEOS, wherein the remaining structure includes the base poly protect layer to form an RF shielded LDMOS FET; removing the photoresist; patterning and etching the NPN base; removing the photoresist; forming contacts on the gate, source, body and gate shield and depositing a layer of metal over the exposed contacts and gate shields; forming silicide on contacts and gate shields, using rapid thermal anneal RTA; and depositing and defining a final layer of insulator material and a final metal layer to form interconnects and bond pads on the BICMOS device.

DESCRIPTION OF THE VIEWS OF THE DRAWING

FIG. 2 is a cross section of a CMOS transistor structure having a gate shield according to another embodiment of the present invention.

FIG. 2A is an enlarged section of FIG. 2 detailing the gate shield structure according to another embodiment of the present invention.

FIG. 4 is a cross section of a CMOS transistor structure having a gate shield according to a fourth embodiment of the present invention.

FIG. 4A is an enlarged section of FIG. 4 detailing the gate shield structure according to a fourth embodiment of the present invention.

In the drawings, like reference numerals are sometimes used to designate like structural elements. It should also be appreciated that the depictions in the figures are diagrammatic and not to scale.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Figure 1:
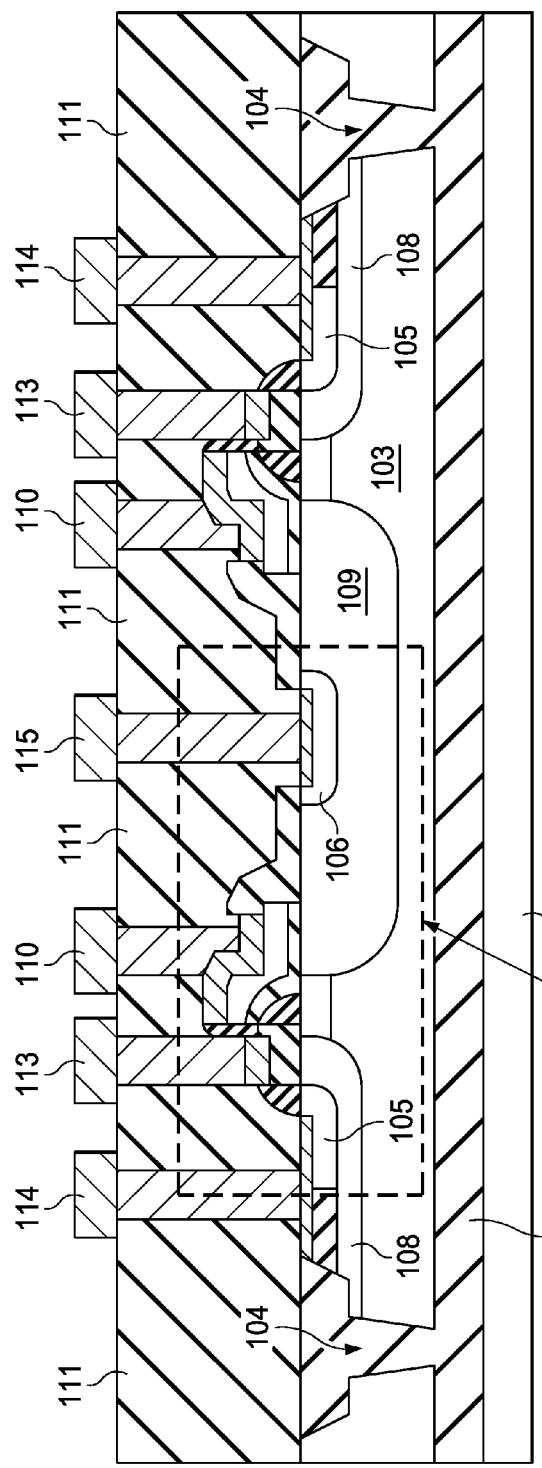
FIG. 1 is a cross section of a CMOS transistor structure having a gate shield according to one embodiment of the present invention.
Figure 3:
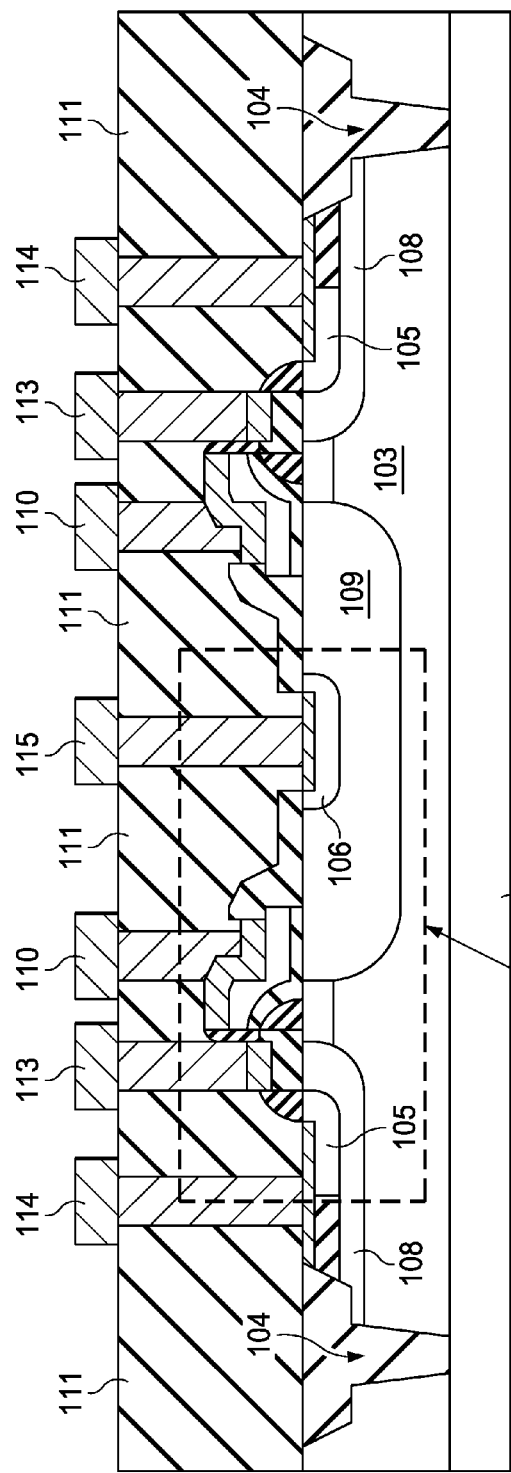
FIG. 3 is a cross section of a CMOS transistor structure having a gate shield according to a third embodiment of the present invention.

The invention includes a laterally diffused metal oxide semiconductor LDMOS, having a gate shield, fabricated in a SiGe BICMOS technology. A SiGe BICMOS wafer can be fabricated on an SOI substrate as shown in FIGS. 1 and 2 or on a bulk silicon substrate as shown in FIGS. 3 and 4. Embodiments of this invention will be disclosed using both bulk silicon substrates and SOI substrates. It should be understood that they are presented by way of example only and not limitation. Numerous changes to the disclosed embodiments can be made in accordance with the disclosure herein without departing from the spirit or scope of the invention. Thus, the breadth and scope of the present invention should not be limited by any of the embodiments described below. Rather, the scope of the invention should be defined in accordance with the following claims and their equivalents.

Figure 1A:
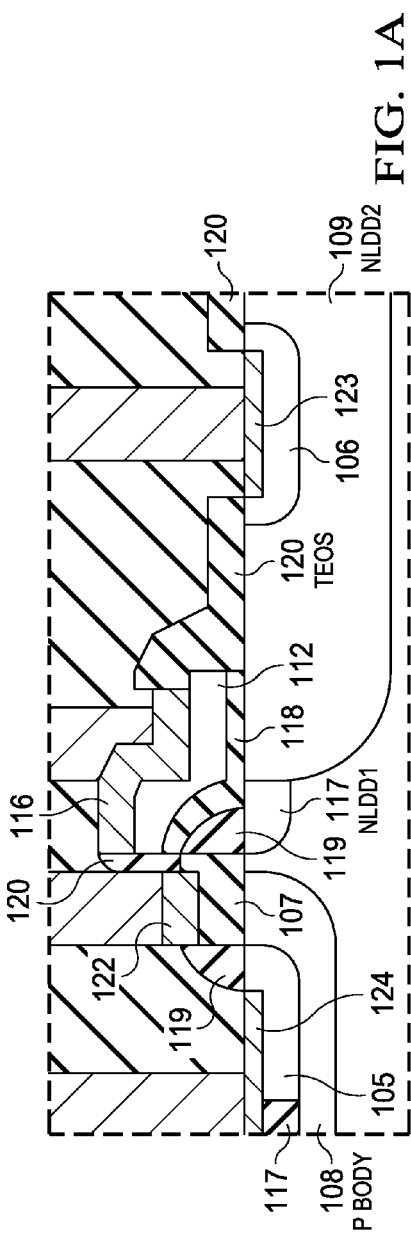
FIG. 1A is an enlarged section of FIG. 1 detailing the gate shield structure according to one embodiment of the present invention.

In accordance with one embodiment of the invention, the structure of a MOSFET transistor in a SiGe BICMOS technology will be described with reference to a laterally diffused metal oxide semiconductor LDMOS transistor, but it is to be understood that the invention is applicable to other MOSFET transistors including an extended drain MOSFET transistor, and a vertical DMOS transistor. FIG. 1 is a section view illustrating an LDMOS transistor in accordance with one embodiment of the invention and FIG. 1A is an exploded view of the shield structure of FIG. 1. In FIGS. 1 and 1A, the device includes a silicon substrate 101, a buried oxide (BOX) 102 formed thereon. An active device region 103 is formed on the surface of the BOX, wherein deep trench isolation channels 104 define LDMOS transistor areas. The deep trench isolation channels extend from the top of wafer down to and coupling with the BOX. Body wells 108 are formed in the active device region 103. Lateral drain wells 109 are also formed in the active device region 103, wherein the body wells 108 and the lateral drain wells 109 are spaced apart from one another and do not touch. A photoresist layer is used to mask source/drain areas and the source 105 and drain 106 are then formed by implantation of a dopant. A silicide source contact 124 is then formed on the source area 105, and a silicide drain contact 123 is then formed on the drain area 106. Sources 105 and drains 106 are formed in the LDMOS transistor areas with lateral spacing between them, wherein a gate structure is formed on the body 108 located on the space between the sources 105 and the active device region 103. The gate structure includes gate oxide 107 applied across the body well 108 between the source 105 and the active device region 103, with a shield contact 116 formed on the surface of gate oxide.

A gate shield 112 is formed on a seed layer above the surface of a MOSFET device and between the gate contact 122 and the drain 106 wherein the shield electrode 110, shield contact 116, and the gate shield 112 are separated from the gate contact 122 by a base shield spacer 120. The shield 112 is also separated from the gate oxide 107 by a gate poly spacer 119 and shield dielectric 118. The shield 112 is preferably a P doped silicide, which is formed alongside with a bipolar base structure of a bipolar transistor using the BICMOS technology. In other embodiments, the shield 112 can also be an N doped silicide, which is formed alongside with a bipolar base structure of a bipolar transistor using the BICMOS technology.

A dielectric 111 is then formed on the LDMOS structure. A photoresist layer is used to mask the dielectric and then a wet etch or a dry etch process is applied to remove the layer 111 from the source, drain, gate and body contacts. The etch step stops at the source, drain, gate, gate shield and body contacts.

Finally a metal deposition and metal mask and etch are used to form the gate electrode 113, the body electrode and source electrode 114, gate shield electrode 110 and drain electrode 115. In this embodiment, the shield 112 abuts to, but does not overlap the gate oxide 107, but is confined to a limited area between shield contact 116 and a portion of the lateral drain well 109.

In accordance with another embodiment of the invention, the structure of another MOSFET transistor in a SiGe BICMOS technology will be described with reference to a laterally diffused metal oxide semiconductor LDMOS transistor, but it is to be understood that the invention is applicable to other MOSFET transistors including an extended drain MOSFET transistor, and a vertical DMOS transistor. FIG. 2 is a section view illustrating an LDMOS transistor in accordance with another embodiment of the invention and FIG. 2A is an exploded view of the shield structure of FIG. 2. In FIGS. 2 and 2A, the device includes a silicon substrate 101, a buried oxide (BOX) 102 formed thereon. An active device region 103 is formed on the surface of the BOX, wherein deep trench isolation channels 104 define LDMOS transistor areas. The deep trench isolation channels extend from the top of wafer down to and coupling with the BOX. Body wells 108 are formed in the active device region 103. Lateral drain wells 109 are also formed in the active device region 103, wherein the body wells 108 and the lateral drain wells 109 are touching one another. A shallow trench isolation region 121 is included in the lateral drain well 109 and extends laterally outwardly from a drain 106 but does not touch the sides of the lateral drain well 109. A photoresist layer is used to mask source/drain areas and the source 105 and drain 106 are then formed by implantation of a dopant. Sources 105 and drains 106 are formed in the LDMOS transistor areas with lateral spacing between them, wherein a gate structure is formed on the space on the body well 108 between the sources 105 and the lateral drain region 109. The gate structure includes gate oxide 107 applied across the body region between the source 105 and lateral drain region 109, with a gate contact 122 formed on the surface of gate oxide 107.

A gate shield 112 is formed on a seed layer above the surface of a MOSFET device between the gate contact 122 and the lateral drain region 109 which is close to both the gate contact 122 and the lateral drain region 109 surfaces but not shorting to them. The shield 112 is preferably a P doped silicide, which is formed alongside with a bipolar base structure of a bipolar transistor using the BICMOS technology. In another embodiment the shield 112 can be an N doped silicide, which is formed alongside with a bipolar base structure of a bipolar transistor using the BICMOS technology.

A dielectric 111 is then formed on the LDMOS structure. A photoresist layer is used to mask the dielectric and then a wet etch or a dry etch process is applied to remove the layer 111 from the source, drain, gate, shield and body contacts. The etch step stops at the source, drain, gate, shield and body contacts.

Finally a metal deposition and metal mask and etch are used to form the Body electrode 114, gate electrode 113, source electrode 114, gate shield electrode 110 and drain electrode 115. In this embodiment, the shield 112 abuts to, but does not overlap the gate contact 122, but overlaps a limited area with the lateral drain region 109 including a portion of the shallow trench isolation region 121.

Figure 3A:
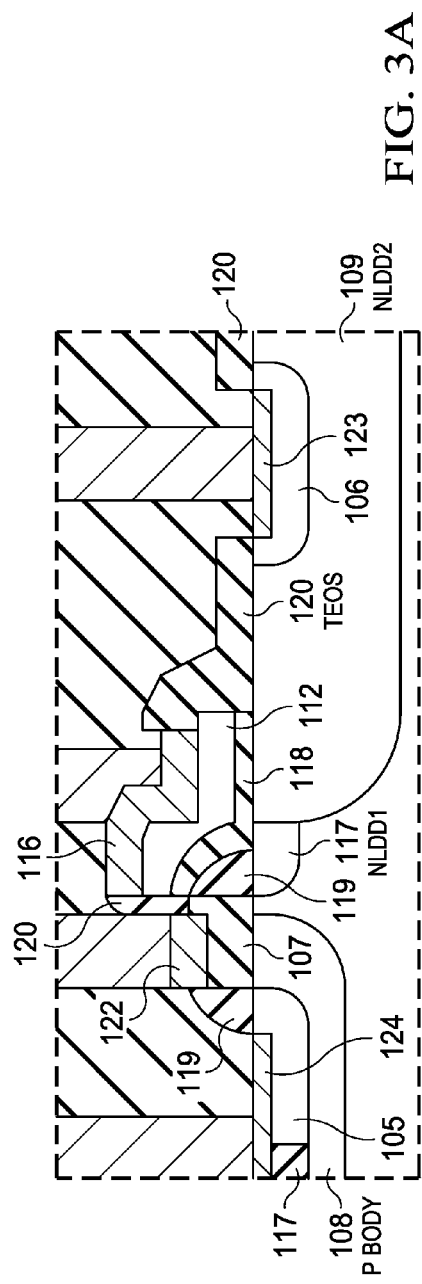
FIG. 3A is an enlarged section of FIG. 3 detailing the gate shield structure according to a third embodiment of the present invention.

In accordance with a third embodiment of the invention, the structure of a MOSFET transistor in a SiGe BICMOS technology will be described with reference to a laterally diffused metal oxide semiconductor LDMOS transistor, but it is to be understood that the invention is applicable to other MOSFET transistors including an extended drain MOSFET transistor, and a vertical DMOS transistor. FIG. 3 is a section view illustrating an LDMOS transistor in accordance with one embodiment of the invention and FIG. 3A is an exploded view of the shield structure of FIG. 3. In FIGS. 3 and 3A, the device includes a bulk silicon substrate 101, and an active device region 103 formed on the top surface of the bulk substrate 101, wherein deep trench isolation channels 104 define LDMOS transistor areas. Body wells 108 are formed in the active device region 103. Lateral drain wells 109 are also formed in the active device region 103, wherein the body wells 108 and the lateral drain wells 109 are spaced apart from one another and do not touch. A photoresist layer is used to mask source/drain areas and the source 105 and drain 106 are then formed by implantation of a dopant. Sources 105 and drains 106 are formed in the LDMOS transistor areas with lateral spacing between them, wherein a gate structure is formed on the body 108 located on the space between the sources 105 and the active device region 103. The gate structure includes gate oxide 107 applied across the body well 108 between the source 105 and the active device region 103, with a shield contact 116 formed on the surface of gate oxide.

A gate shield 112 is formed on the surface of a MOSFET device and between the gate contact 122 116 and the drain 106 wherein the shield electrode 110, shield contact 116, and the gate shield 112 are separated from the gate contact 122 by a base shield spacer 120. The shield 112 is also separated from the gate oxide 107 by a gate poly spacer 119 and shield dielectric 118. The shield 112 is preferably a P doped silicide, which is formed alongside with a bipolar base structure of a bipolar transistor using the BICMOS technology. In other embodiments, the shield 112 can also be an N doped silicide, which is formed alongside with a bipolar base structure of a bipolar transistor using the BICMOS technology.

A dielectric 111 is then formed on the LDMOS structure. A photoresist layer is used to mask the dielectric and then a wet etch or a dry etch process is applied to remove the layer 111 from the source, drain, gate and body contacts. The etch step stops at the source, drain, gate, gate shield and body contacts.

Finally a metal deposition and metal mask and etch are used to form the gate electrode 113, the body electrode and source electrode 114, gate shield electrode 110 and drain electrode 115. In this embodiment, the shield 112 abuts to, but does not overlap the gate oxide 107, but is confined to a limited area between gate contact 122 and a portion of the lateral drain well 109.

In accordance with a fourth embodiment of the invention, the structure of another MOSFET transistor in a SiGe BICMOS technology will be described with reference to a laterally diffused metal oxide semiconductor LDMOS transistor, but it is to be understood that the invention is applicable to other MOSFET transistors including an extended drain MOSFET transistor, and a vertical DMOS transistor. FIG. 4 is a section view illustrating an LDMOS transistor in accordance with another embodiment of the invention and FIG. 4A is an exploded view of the shield structure of FIG. 4. In FIGS. 4 and 4A, the device includes a bulk silicon substrate 101, an active device region 103 is formed on the surface of the bulk silicon substrate 101, wherein deep trench isolation channels 104 define LDMOS transistor areas. Body wells 108 are formed in the active device region 103. Lateral drain wells 109 are also formed in the active device region 103, wherein the body wells 108 and the lateral drain wells 109 are touching one another. A shallow trench isolation region 121 is included in the lateral drain well 109 and extends laterally outwardly from a drain 106 but does not touch the sides of the lateral drain well 109. A photoresist layer is used to mask source/drain areas and the source 105 and drain 106 are then formed by implantation of a dopant. Sources 105 and drains 106 are formed in the LDMOS transistor areas with lateral spacing between them, wherein a gate structure is formed on the space on the body well 108 between the sources 105 and the lateral drain region 109. The gate structure includes gate oxide 107 applied across the body region between the source 105 and lateral drain region 109, with a shield contact 116 formed on the surface of gate oxide.

A gate shield 112 is formed on a seed layer above the surface of a MOSFET device between the gate contact 122 and the lateral drain region 109 which is close to both the gate contact 122 and the lateral drain region 109 surfaces but not shorting to them. The shield 112 is preferably a P doped silicide, which is formed alongside with a bipolar base structure of a bipolar transistor using the BICMOS technology. In another embodiment the shield 112 can be an N doped silicide, which is formed alongside with a bipolar base structure of a bipolar transistor using the BICMOS technology.

A dielectric 111 is then formed on the LDMOS structure. A photoresist layer is used to mask the dielectric and then a wet etch or a dry etch process is applied to remove the layer 111 from the source, drain, gate, shield and body contacts. The etch step stops at the source, drain, gate, shield and body contacts.

Finally a metal deposition and metal mask and etch are used to form the Body electrode 114, gate electrode 113, source electrode 114, gate shield electrode 110 and drain electrode 115. In this embodiment, the shield 112 abuts to, but does not overlap the gate contact 122, but overlaps a limited area with the lateral drain region 109 including a portion of the shallow trench isolation region 121.

Use of the structures listed above improves Breakdown Voltage BV and Radio Frequency performance of the LDMOS devices. In addition, use of this method will improve reliability and device robustness of these structures.

Figure 5:
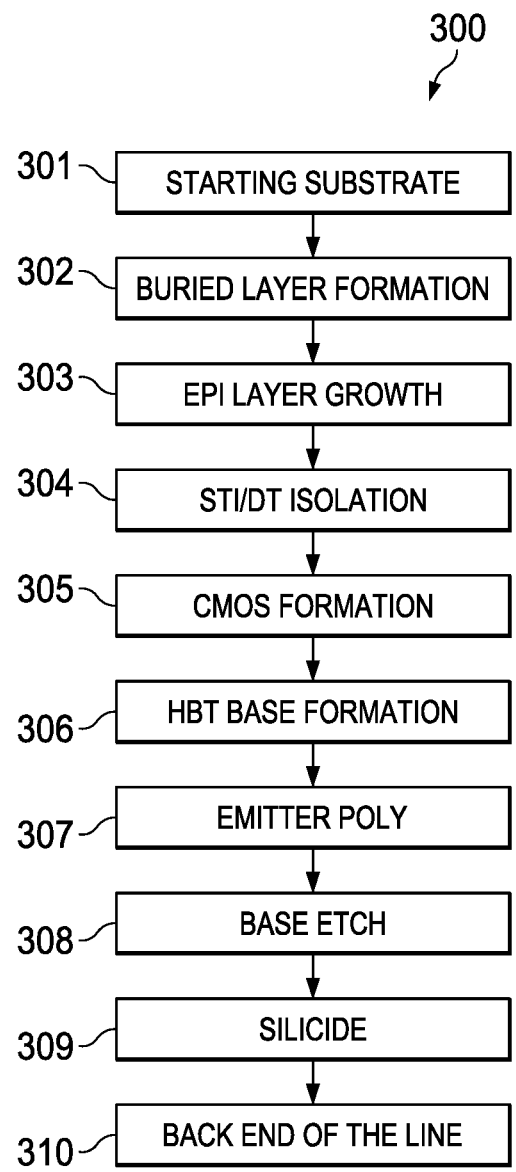
FIG. 5 flow chart detailing the process steps required to fabricate the BICMOS devices detailed in one embodiment of the present invention.

In practice, the method of forming the BICMOS technology is shown in the flow chart 300 of FIG. 5.

The first step 301 is providing a bulk silicon p-type wafer which can have a uniform doping concentration of approximately 1e15 cm$^3$ or a silicon on insulator SOI wafer.

Next step 302 is to pattern using conventional photoresist processes and implant an N+ buried layer NBL 140 and/or a P+ buried layer PBL 141.

Next step 303 is to grow an epitaxial layer to provide an active device region 103.

Step 304 is to form a deep trench isolation region 104 that surrounds and separates each bipolar transistor where necessary, also provide junction isolation to surround and separate CMOS transistors where necessary.

Step 305 is to deposit and form gate oxide 107, gate poly patterns and also implant spacers.

Step 306 is to form base windows and deposit base epi layer on the wafer.

Step 307 is to deposit an epitaxial polysilicon layer (a.k.a. base-epitaxial poly layer) to form the bases 142 of the bipolar transistors (see FIGS. 5C-5D, and 5F) as well as the gate shield 112 of the LDMOS transistor as shown in FIG. 1.

Step 308 is to use a single poly base mask 511 to pattern and etch the bases 142 for the bipolar transistor and in the same operation, pattern and etch the gate shields 112 of the LDMOS transistor.

Step 309 is to form contacts where necessary and deposit cobalt Co, titanium Ti, Nickel Ni or platinum Pt over exposed contacts and gate shields. Using rapid thermal anneal RTA, form a silicide on contacts, gate shield electrode 110 and other necessary areas.

Step 310 is to deposit multi-layers of a metal aluminum and insulator material SiO2 to form interconnects and bond pad on the BICMOS device.

FIGS. 5A through 5E show cross sections of the BICMOS wafer as it goes through processing.

The process starts with providing an SOI or bulk silicon wafer. In the current embodiment, an SOI wafer is chosen. The SOI wafer includes a substrate 101, a first silicon layer 103A and a buried oxide BOX 102 between the substrate 101 and the first silicon layer 103A. N+NBL and P+PBL impurities are implanted in the top surface of the first silicon layer 103A, in areas designated as NPN or PNP transistors respectively in the completed wafer, to form an NBL region 140 and a PBL region. A second silicon layer 103B is deposited over and touching the NBL region 140, the PBL region 141 and the first silicon layer 103A. The first silicon layer 103A and the second silicon layer 103B in combination form the active device layer 103.

P- and N-wells are formed in the active device layer 103 to form the bodies of the N channel and P channel transistors respectively. Gate oxide is deposited, sources and drains are defined and implanted and gate poly is deposited and defined.

A poly seal is deposited on the gate poly. A poly seal oxide can be 80 Å of SiO2 grown on the poly, using 900° C. Dilute Dry O2 for 44 minutes.

A spacer material is deposited on the poly seal. The spacer material can be 300 Å PECVD TEOS.

Figure 5A:
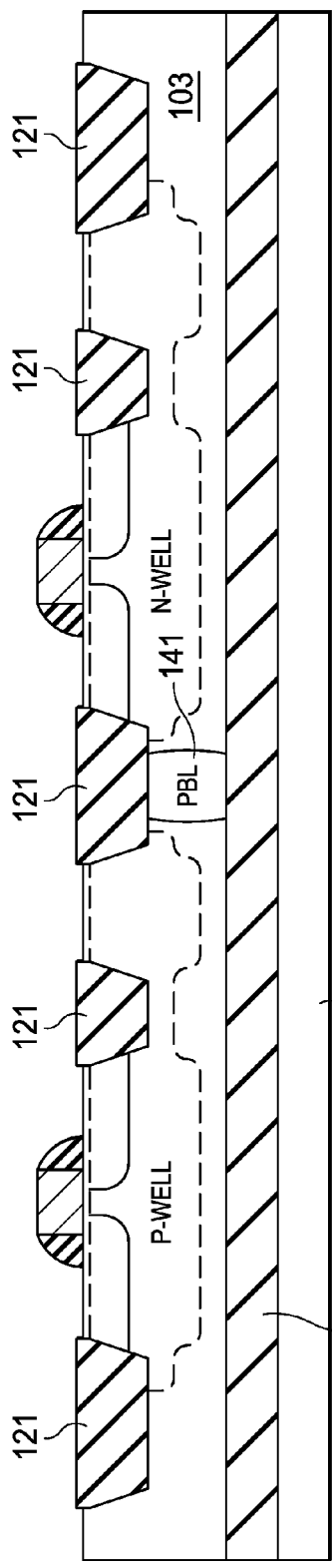
FIG. 5A shows a cross section of the BICMOS wafer illustrating the CMOS area after spacer etch process according to one embodiment of the present invention.

The spacer nitride can be a 1000 Å Nitride deposition for 141 Minutes at 705° C. The spacer is etched using a LAM etcher FIG. 5A shows a cross section of the BICMOS wafer illustrating the CMOS area after spacer etch step 305.

A 200 Å tetraethyl orthosilicate (TEOS) layer is deposited over the wafer. The 200 Å TEOS Deposition can be accomplished in a furnace at 684° C. for 160 minutes.

Deposit a 500 Å Amorphous-silicon seed layer for 27 minutes at 550° C.

Figure 5B:
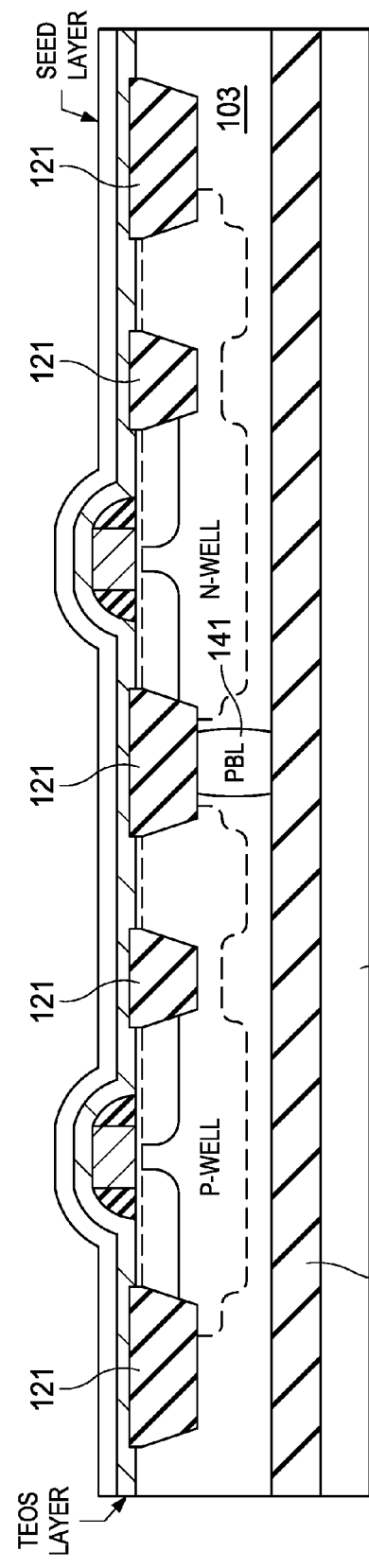
FIG. 5B shows a cross section of the BICMOS wafer illustrating the CMOS area after the seed layer deposition according to one embodiment of the present invention.

FIG. 5B shows a cross section of the BICMOS wafer illustrating the CMOS area after the seed layer deposition, step 305.

Pattern and etch the NPN base oxide window (OWIND) and strip the photoresist after etching.

Figure 5C:
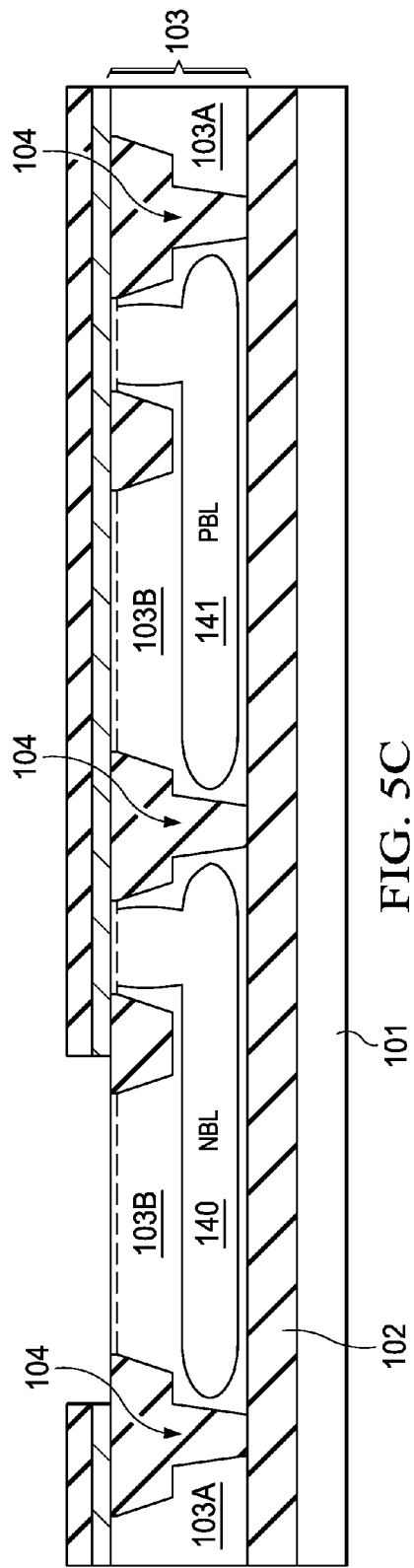
FIG. 5C shows a cross section of the BICMOS wafer illustrating the bipolar area after the NPN base window definition process according to one embodiment of the present invention.

FIG. 5C shows a cross section of the BICMOS wafer illustrating the bipolar area after the NPN base window definition process, step 306.

The NPN Base Epi deposition can be accomplished in 2 minutes at 825° C., using a Dual Box SiGe: C profile. A Boron spike is then provided in the base and a lightly doped silicon cap layer (~40 nm) is provided to provide a 1100 Å Single Crystal layer in the active region 103.

Figure 5D:
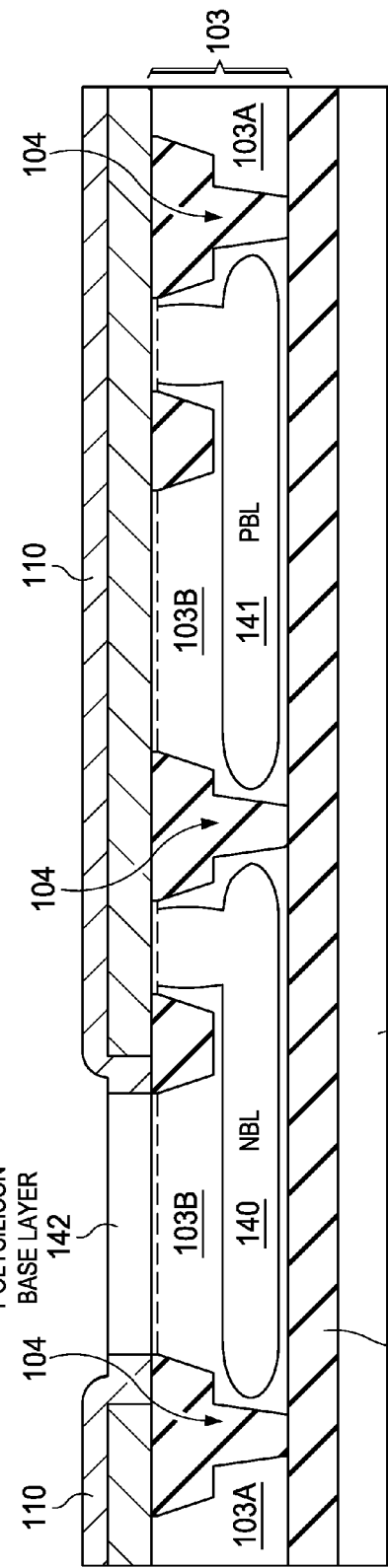
FIG. 5D shows a cross section of the BICMOS wafer illustrating the bipolar area after the NPN base epi deposition process according to one embodiment of the present invention.

FIG. 5D shows a cross section of the BICMOS wafer illustrating the bipolar area after the NPN base epi deposition process, step 306 to step 308. The base epi deposition applies to the seed layer of the ED-MOSFET region (See, FIGS. 5B and 5E) as well to provide a foundation of the gate shield 112.

Pattern and etch to form the poly shield 112. The NPN poly base layer can be etched with a LAM etcher mask 511. Etch base-epi poly on STI field oxide 121 etching will stops on the oxide window TEOS. This structure keeps the base poly protect layer to form an RF shielded LD-MOSFET or ED-MOSFET.

Remove the photoresist.

Figure 5E:
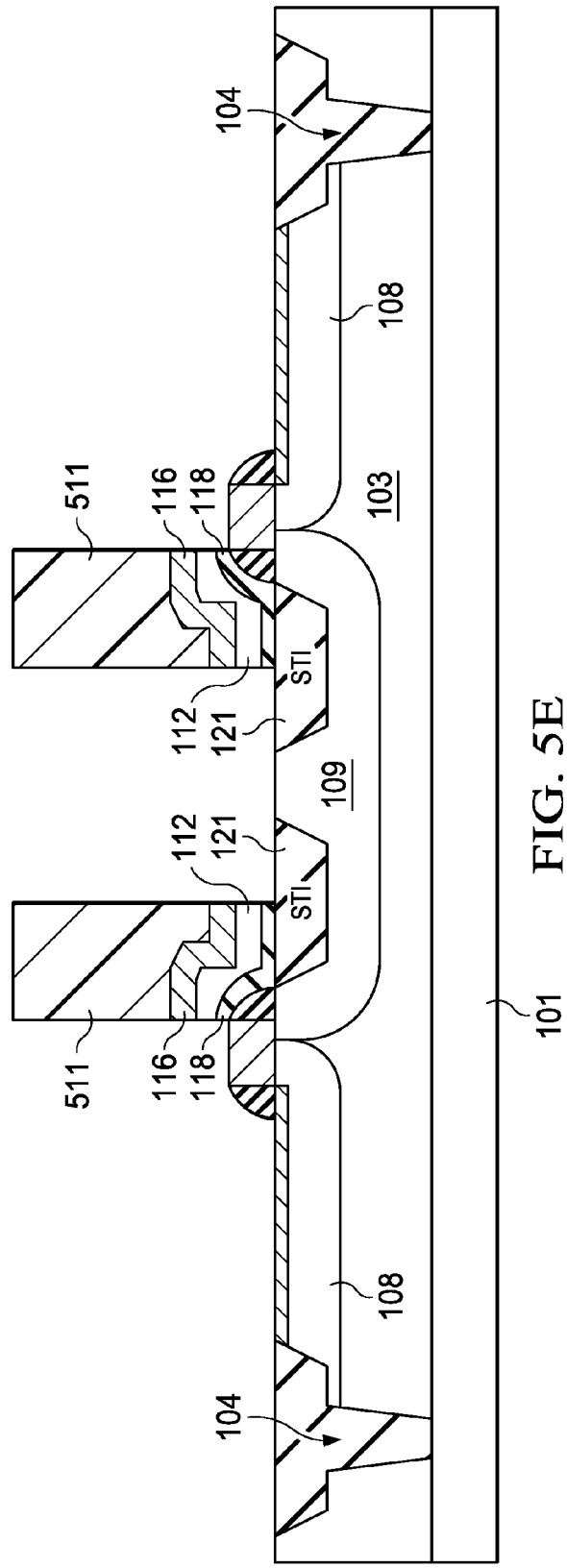
FIG. 5E shows a cross section of the BICMOS wafer illustrating the CMOS area after the poly shield etch process according to one embodiment of the present invention.

FIG. 5E shows a cross section of the BICMOS wafer illustrating the CMOS area after the poly shield etch process, step 307 to step 308.

Pattern and etch the NPN base. The NPN poly base can be etched with a LAM etcher mask 511. Etch base-epi poly on STI field oxide 121 etching will stops on the oxide window TEOS. This pattern and etch step is concurrent with the one as shown in FIG. 5E as it also removes base poly layer not belonging to the gate shield 112 from CMOS.

Remove the photoresist.

Figure 5F:
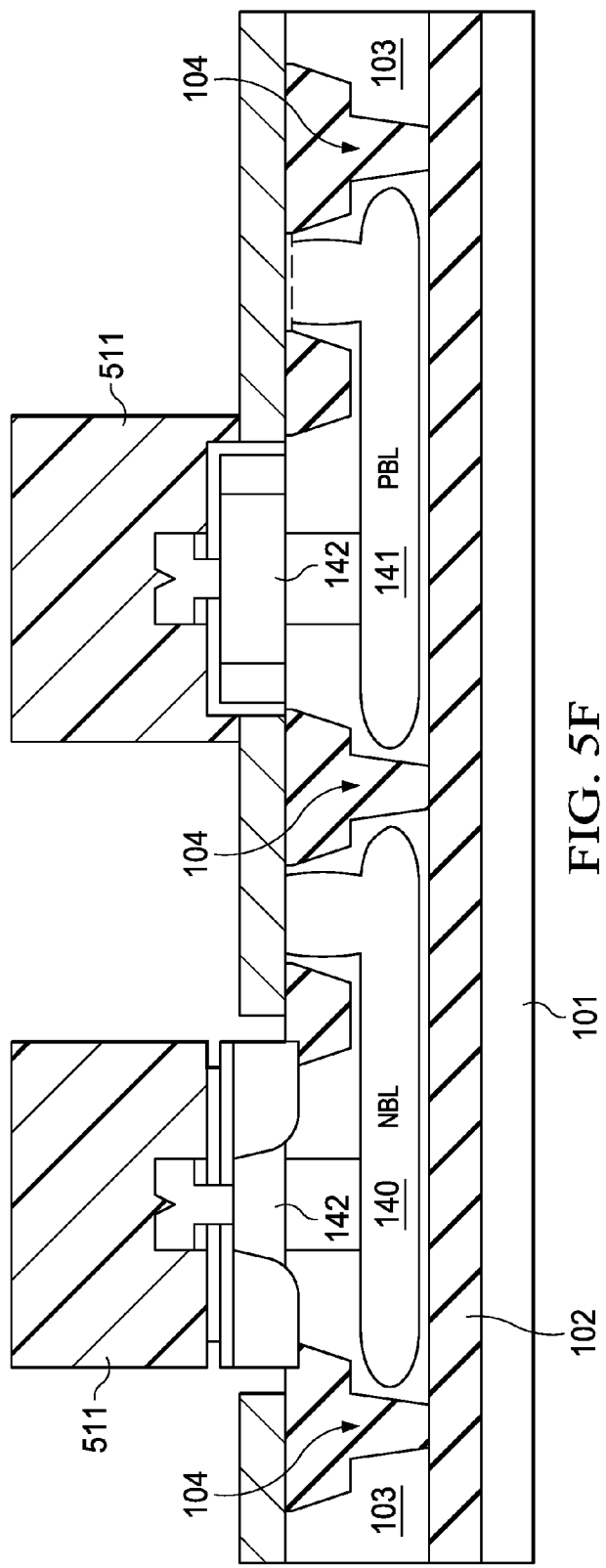
FIG. 5F shows a cross section of the BICMOS wafer illustrating the Bipolar area after the poly NPN base poly etch process according to one embodiment of the present invention.

FIG. 5F shows a cross section of the BICMOS wafer illustrating the bipolar area after the poly NPN base poly etch process, step 308.

Figure 6:
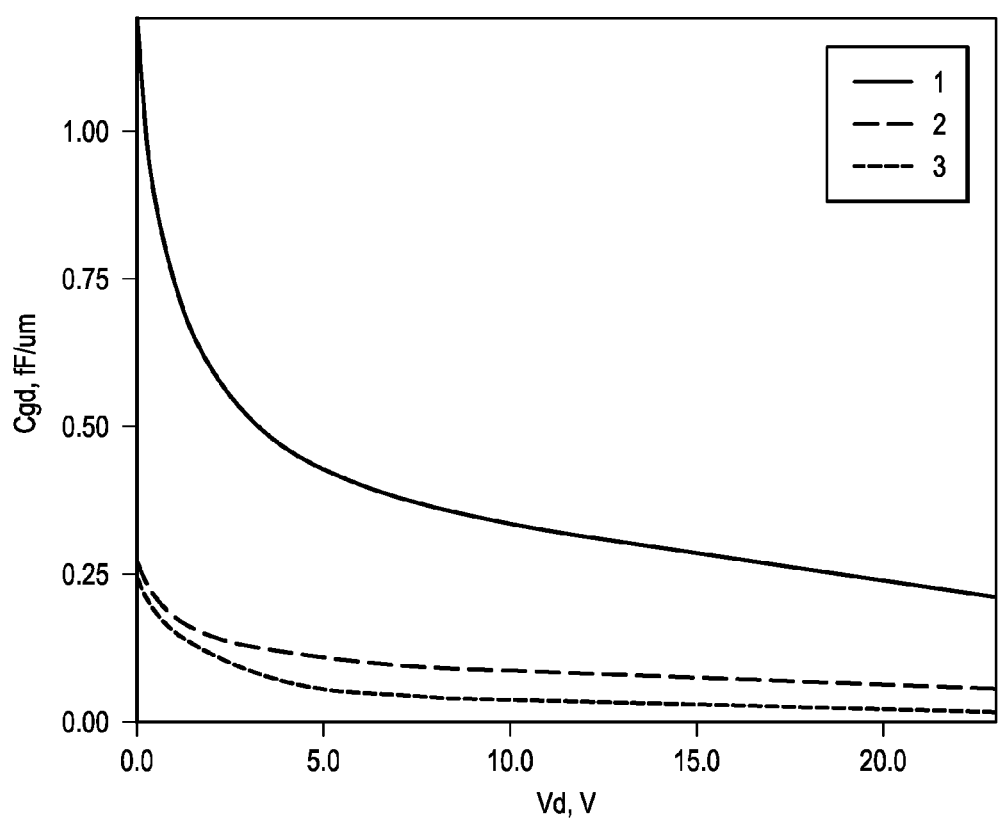
FIG. 6 show a gate to drain capacitance $C_{gd}$ comparison of an LDMOS transistors with a gate shield (1) using a prior art, with a gate shield (2) using a metal shield and a gate shield (3) using a HBT base shield according to one embodiment of the present invention.

FIG. 6 show a gate to drain capacitance $C_{gd}$ comparison of an LDMOS transistors with a gate shield (1) using a prior art, with a gate shield (2) using a metal shield and a gate shield (3) using a HBT base shield, wherein the shield biases are 3.3V. It can be seen that gate shield (3) has much better performance that gate shield (1) and slightly better performance than gate shield (2).

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method, comprising:
   developing a bipolar transistor region on a substrate;
   developing a metal oxide semiconductor (MOS) transistor region on the substrate and spaced apart from the bipolar transistor region;
   depositing a polysilicon layer over the bipolar transistor region and the MOS transistor region; and
   etching the polysilicon layer using a single mask to form:
   a base above the bipolar transistor region; and
   a gate shield above the MOS transistor region.

2. The method of claim 1, wherein the MOS transistor region includes a laterally diffused metal oxide semiconductor (LDMOS) transistor region.

3. The method of claim 1, wherein the MOS transistor region includes an extended drain metal oxide semiconductor (EDMOS) transistor region.

4. The method of claim 1, wherein the MOS transistor region includes a vertical drain metal oxide semiconductor (VDMOS) transistor region.

5. The method of claim 1, wherein the depositing the polysilicon layer includes epitaxially growing the polysilicon layer over the bipolar transistor region and the MOS transistor region.

6. The method of claim 1, further comprising:
   developing a buried layer on the substrate,
   wherein the developing the bipolar transistor region includes developing the bipolar transistor region above the buried layer, and
   wherein the developing the MOS transistor region includes developing the MOS transistor region above the buried layer.

7. The method of claim 1, further comprising:
developing a body region within the MOS transistor region;
developing a drain well within the MOS transistor region and spaced apart from the body region; and
forming a gate structure above the body region, and the gate structure free of overlapping the drain well,
wherein the single mask defines the gate shield laterally above the gate structure and extending to partially overlap the drain well.

8. The method of claim 7, further comprising:
developing a drain region within the drain well;
forming a gate electrode coupled to the gate structure; and
forming a drain electrode coupled to the drain region,
wherein the single mask defines the gate shield positioned between the gate electrode and the drain electrode.

9. The method of claim 7, further comprising:
developing a drain region within the drain well;
developing a source region within the body region;
forming a source electrode coupled to the source region; and
forming a drain electrode coupled to the drain region,
wherein the single mask defines the gate shield positioned between the source electrode and the drain electrode.

10. The method of claim 7, wherein the forming the gate structure is performed before the depositing the polysilicon layer and the etching the polysilicon layer.

11. The method of claim 1, further comprising:
developing a body region within the MOS transistor region;
developing a drain well within the MOS transistor region and spaced apart from the body region;
developing a shallow trench isolation (STI) structure within the MOS transistor region and between the drain well and the body region; and
forming a gate structure above the body region, and the gate structure free of overlapping the drain well and the STI structure,
wherein the single mask defines the gate shield laterally above the gate structure and extending to partially overlap with the STI structure.

12. The method of claim 1, further comprising:
forming a gate shield electrode coupled to the gate shield and configured to receive a shield bias voltage.

13. The method of claim 1, wherein the polysilicon layer includes a P doped silicide material.

14. The method of claim 1, further comprising:
forming a first deep trench isolation channel laterally surrounding the bipolar transistor region; and
forming a second deep trench isolation channel laterally surrounding the MOS transistor region.

15. A method, comprising:
developing a bipolar transistor region on a substrate;
developing a laterally diffused metal oxide semiconductor (LDMOS) transistor region on the substrate and spaced apart from the bipolar transistor region;
depositing a polysilicon layer over the bipolar transistor region and the LDMOS transistor region; and
etching the polysilicon layer using a single mask to form:
a base above the bipolar transistor region; and
a gate shield above the LDMOS transistor region.

16. The method of claim 15, further comprising:
developing a body region within the LDMOS transistor region;
developing a drain well within the LDMOS transistor region and spaced apart from the body region; and
forming a gate structure above the body region, and the gate structure free of overlapping the drain well,
wherein the single mask defines the gate shield laterally above the gate structure and extending to partially overlap with the drain well.

17. The method of claim 16, further comprising:
developing a drain region within the drain well;
forming a gate electrode coupled to the gate structure; and
forming a drain electrode coupled to the drain region,
wherein the single mask defines the gate shield positioned between the gate electrode and the drain electrode.

18. A method, comprising:
developing a bipolar transistor region on a substrate;
developing an extended drain metal oxide semiconductor (EDMOS) transistor region on the substrate and spaced apart from the bipolar transistor region;
depositing a polysilicon layer over the bipolar transistor region and the EDMOS transistor region; and
etching the polysilicon layer using a single mask to form:
a base above the bipolar transistor region; and
a gate shield above the EDMOS transistor region.

19. The method of claim 18, further comprising:
developing a body region within the EDMOS transistor region;
developing a drain well within the EDMOS transistor region and spaced apart from the body region;
developing a shallow trench isolation (STI) structure within the EDMOS transistor region and between the drain well and the body region; and
forming a gate structure above the body region, and the gate structure free of overlapping the drain well and the STI structure, and
wherein the single mask defines the gate shield laterally above the gate structure and extending to partially overlap with the STI structure.

20. The method of claim 19, further comprising:
developing a drain region within the drain well;
forming a gate electrode coupled to the gate structure; and
forming a drain electrode coupled to the drain region,
wherein the single mask defines the gate shield positioned between the gate electrode and the drain electrode.

* * * * *